United States Patent
Blattler et al.

(10) Patent No.: US 10,755,884 B2
(45) Date of Patent: Aug. 25, 2020

(54) FUSE ELEMENT

(75) Inventors: Hans-Peter Blattler, Adligenswil (CH); Peter Straub, Oberwil/Zug (CH); Jose Ramos, Buchrain (CH)

(73) Assignee: SCHURTER AG, Lucerne (CH)

( * ) Notice: Subject to any disclaimer, the term of this patent is extended or adjusted under 35 U.S.C. 154(b) by 1026 days.

(21) Appl. No.: 13/161,544

(22) Filed: Jun. 16, 2011

(65) Prior Publication Data
US 2012/0013431 A1   Jan. 19, 2012

(30) Foreign Application Priority Data

Jul. 16, 2010   (EP) .................................. 10007390

(51) Int. Cl.
| H01H 85/046 | (2006.01) |
| H01H 85/02 | (2006.01) |
| H05K 1/02 | (2006.01) |
| H05K 1/03 | (2006.01) |
| H01H 69/02 | (2006.01) |

(52) U.S. Cl.
CPC ....... H01H 85/0241 (2013.01); H05K 1/0293 (2013.01); H05K 1/0373 (2013.01); H01H 69/022 (2013.01); H01H 85/046 (2013.01); H01H 2085/0275 (2013.01); H05K 2201/0209 (2013.01); H05K 2201/10181 (2013.01)

(58) Field of Classification Search
CPC .............. H05K 1/0293; H05K 1/0373; H05K 2201/10181; H05K 2201/0209; H01H 85/0241; H01H 69/022; H01H 85/046; H01H 2085/0275
USPC .......................... 337/296, 297, 159, 227, 290
See application file for complete search history.

(56) References Cited

U.S. PATENT DOCUMENTS 307,639  A  *  11/1884  Gillilend ..................... 337/297
2,166,174  A      7/1939  Rope
(Continued)

FOREIGN PATENT DOCUMENTS

DE  102004063035 A1  8/2005
EP     0484703 A2  5/1992
(Continued)

OTHER PUBLICATIONS

"RO4000 Series High Frequency Circuit Materials", Rogers Corporation Advanced Circuit Materials Division, 2006, XP002615325 (URL: http://sbcinc.com/pdf/rogers/4000.pdf).
(Continued)

Primary Examiner — Anatoly Vortman
(74) Attorney, Agent, or Firm — Bacon & Thomas, PLLC

(57) ABSTRACT

A fuse element, in particular suited for use in electric and/or electronic circuits constructed by multilayer technology, including a printed circuit board substrate material, which is usable particularly in the multilayer technology and is coated with a metal or metal alloy from which the fuse is generated by means of photolithographic and/or printing image-producing techniques and ensuing etching or engraving processes, is proposed. The fuse is distinguished in that the printed circuit board substrate material, on which the fuse can be provided, includes at least a high-temperature-stable, electrically insulating material, with a coefficient of thermal expansion that varies essentially analogously to the coefficient of thermal expansion of the metal or metal alloy from which the fuse is made.

25 Claims, 3 Drawing Sheets

(56) References Cited

U.S. PATENT DOCUMENTS

| | | | |
|---|---|---|---|
| 2,263,752 A * | 11/1941 | Egon | 337/297 |
| 2,288,428 A * | 6/1942 | Egon | 337/29 |
| 2,934,627 A * | 4/1960 | Bristol et al. | 337/293 |
| 2,941,059 A * | 6/1960 | Sims | H01H 85/046 337/187 |
| 3,248,680 A * | 4/1966 | Ganci | 338/266 |
| 3,334,205 A * | 8/1967 | Griffin | 337/198 |
| 3,358,363 A * | 12/1967 | Jacks et al. | 29/623 |
| 3,585,556 A * | 6/1971 | Hingorany et al. | 337/297 |
| 4,140,988 A * | 2/1979 | Oakes | 337/279 |
| 4,296,398 A * | 10/1981 | McGalliard | 337/297 |
| 4,379,318 A * | 4/1983 | Ootsuka | 361/104 |
| 4,394,639 A * | 7/1983 | McGalliard | 337/292 |
| 4,626,818 A * | 12/1986 | Hilgers | 337/166 |
| 4,652,848 A * | 3/1987 | Hundrieser | 337/297 |
| 4,873,506 A * | 10/1989 | Gurevich | 337/290 |
| 5,097,246 A * | 3/1992 | Cook et al. | 337/297 |
| 5,097,247 A * | 3/1992 | Doerrwaechter | 337/405 |
| 5,099,219 A * | 3/1992 | Roberts | 337/297 |
| 5,130,689 A * | 7/1992 | Raykhtsaum et al. | 337/296 |
| 5,309,625 A * | 5/1994 | Onishi | 29/623 |
| 5,432,378 A * | 7/1995 | Whitney et al. | 257/529 |
| 5,543,774 A * | 8/1996 | Lof | 337/297 |
| 5,712,610 A * | 1/1998 | Takeichi et al. | 337/290 |
| 5,777,540 A * | 7/1998 | Dedert et al. | 337/142 |
| 5,790,008 A * | 8/1998 | Blecha et al. | 337/297 |
| 5,914,649 A * | 6/1999 | Isono et al. | 337/297 |
| 5,923,239 A * | 7/1999 | Krueger et al. | 337/297 |
| 5,929,741 A * | 7/1999 | Nishimura et al. | 337/290 |
| 5,963,121 A * | 10/1999 | Stygar et al. | 337/155 |
| 6,002,322 A * | 12/1999 | Krueger et al. | 337/297 |
| 6,034,589 A * | 3/2000 | Montgomery et al. | 337/296 |
| 6,043,966 A | 3/2000 | Krueger et al. | |
| 6,384,708 B1 * | 5/2002 | Jollenbeck et al. | 337/297 |
| 6,710,699 B2 * | 3/2004 | Kaltenborn et al. | 337/297 |
| 7,088,216 B2 * | 8/2006 | Furuuchi | 337/183 |
| 7,116,208 B2 * | 10/2006 | Nishimura et al. | 337/296 |
| 7,385,475 B2 * | 6/2008 | Bender et al. | 337/297 |
| 7,436,284 B2 * | 10/2008 | Bender et al. | 337/297 |
| 7,477,130 B2 * | 1/2009 | Fukushige et al. | 337/297 |
| 7,570,148 B2 * | 8/2009 | Parker et al. | 337/297 |
| 2003/0142453 A1 * | 7/2003 | Parker | H01H 85/0047 361/104 |
| 2004/0190269 A1 | 9/2004 | Makaran et al. | |

FOREIGN PATENT DOCUMENTS

| | | | | |
|---|---|---|---|---|
| EP | | 1045625 A1 | 10/2000 | |
| WO | | 2006091938 A2 | 8/2006 | |
| WO | WO | 2010081873 A1 * | 7/2010 | C08L 77/06 |
| WO | WO | 2010139363 A1 * | 12/2010 | H01H 85/055 |

OTHER PUBLICATIONS

"Thermally Conductive Multilayerable Epoxy Laminate and Prepreg", Arlon Incorporated, 2009, XP002615326 (URL: http://www.arlon-med.com/91ML.pdf.)

"Pb Free RoHS Compliant Solutions", DDi Corporate Headquarters, 2010, XP002615327 (URL: http://www.ddiglobal.com/technology/rohr.cfm).

First Official Action in Japanese patent application 2011-148107, dated May 7, 2013.

Official Action in Korean patent application 10-2011-0061252, dated Oct. 30, 2012.

Official Action and Written Opinion in Singapore patent application 201105084-6, dated Nov. 5, 2012.

Korean Patent No. 10-1368901, dated Feb. 24, 2014, and English translation of granted claims.

Decision to grant of corresponding Taiwan patent application No. 100117947, dated Apr. 28, 2014, and English translation of granted claims.

Decision to grant of corresponding Japan patent application JP 2011-148107, dated Apr. 24, 2014, and English translation of granted claims.

Official action of the Intellectual Property Office of the Philippines Bureau of Patents for Application No. 1/2011/000201, dated Apr. 3, 2014, and allowed claims.

\* cited by examiner

FUSE ELEMENT

BACKGROUND OF THE INVENTION

1. Field of the Invention

The invention relates to a fuse element, in particular suited for use in electric and/or electronic circuits constructed by multilayer technology. A printed circuit board material, is coated with a metal or metal alloy. The fuse is generated by means of photolithographic and/or printed image-producing techniques and ensuing etching or engraving processes.

2. Related Art

Circuit boards are used in the manufacture of both electronic and electric circuits, whether with the classical one- or two-sided coating with conductive materials for forming conductor tracks. Circuit boards are also used in what is known as the multilayer technology, in which printed circuit boards formed in many layers are used. Circuit boards are assembled with all conceivable kinds of active and passive electronic and electric components. This assembly is today typically done with PCB assembly machines. All the active and passive electric and electronic elements used must, for the sake of uniform assembly processes using PCB assembly machines, be suitable for automatic assembly with regard to their construction and their manipulability.

Fuse elements form one passive element for this arrangement on printed circuit boards or printed circuit board substrates. Fuse elements are used in many electric and/or electronic circuits that are configured into functional circuits by means of the above-described printed circuit boards or printed circuit board substrates. In the prior art, besides fuse elements formed as separate elements, fuse elements are also known which are typically made from the same materials as in printed circuit board technology. That is, the fuses are formed by means of suitably calculated and dimensioned cross sections out of the material that forms the electrical conductors on the printed circuit board substrates by means of etching or engraving processes. Thus, the fuse itself, which is an integral component of the electric and/or electronic circuit, comprises the conductor material, such as copper or copper alloys, that likewise form the other conductor tracks. The conductor material can, for instance, also be silver or a silver alloy. However, all other metals and metal alloys are possible for forming the conductor tracks and conductor material, to the extent that they meet the pertinent demands.

One essential problem in the embodiment of fuse elements in the case of the metals or metal alloys, such as copper or copper alloys that are laminated onto the printed circuit board substrate, is that the actual printed circuit board material that the printed circuit board substrate comprises (which as a rule is epoxy resin-reinforced, woven glass fabric) has a different temperature expansion coefficient from the material of the conductors, such as copper. As an example, the coefficient of expansion of the epoxy resin mentioned above, which is reinforced with glass fabric, is in the range from 14 to 17 ppm/K, while the coefficient of expansion of copper that forms the conductor tracks is in the range of 17 ppm/K. One disadvantage of the known printed circuit board substrates or printed circuit board material is that until now, they have generally been used for producing printed circuit boards assembled with electric and electronic components and that the operating temperatures of printed circuit board materials thus far typically allow temperatures only below 200° C. This is because higher operating temperatures damage the printed circuit board substrate material. As a consequence of high temperatures, this material loses strength. Delamination and finally decomposition and carbonization of the polymer ensue. This results in conductive, relatively low-impedance layers. The disadvantageous consequence of which is that the minimum requisite insulation resistances of fuses and fuse elements constructed in this way fail to be attained.

In another type of fuse known in the prior art, an $Al_2O_3$ ceramic, which even at very much higher temperatures are stable as fuses on the basis of the above-described printed circuit board substrate material, serves as a basis. However, these fuses on $Al_2O_3$ ceramic have a temperature expansion coefficient that as a rule is below 8 ppm/K, which in turn also has an adverse effect on the stability of the fuse and thus of the entire electric and/or electronic circuit. This is because stresses arise between the actual printed circuit board substrate material and the ceramic that cause cracks in the ceramic and damage it, making it unusable.

A further factor is that a great deal of heat energy flows from the actual fuse element into the thermally highly conductive ceramic. Fuse elements with low rated currents and a fast-acting characteristic can be achieved only with difficulty using the two materials presented above as examples.

BRIEF SUMMARY OF THE INVENTION

It is thus the object of the present invention to create a fuse element which can also be formed integrally in the metal or metal alloy that is applied to a conventional printed circuit board substrate or a multilayer printed circuit board substrate which is suitable for stably withstanding high operating temperatures even above 200° C. that the electronic circuit, including the printed circuit board substrate material on which it is applied, is exposed to. A fuse of this kind should be capable of withstanding high ambient temperatures as well and should also have a high insulation strength. This kind of fuse should furthermore be capable of being manufactured by means of the manufacturing techniques of the kind used for printed circuit boards for receiving electric and electronic elements.

The object of the invention is attained in that the printed circuit board substrate material on which the fuse can be provided comprises an at least high-temperature-stable, electrically insulating material, and at least its coefficient of thermal expansion varies essentially corresponding with the coefficient of thermal expansion of the metal or metal alloy from which the fuse is made.

The advantage of the embodiment according to the invention is essentially that a stable insulation strength of the fuse is ensured at the highest possible ambient temperatures for electric and/or electronic circuits, and it has a current-time behavior that is distinguished highly positively over the previous versions offered in the prior art for making fuses. Moreover, the material and production costs can be reduced considerably compared to the typical fuses known from the prior art.

In an advantageous embodiment of the fuse element, the metal material or metal alloy from which the fuse is generated is copper or a copper alloy, such that the techniques for producing the final embodiment of the printed circuit boards with regard to the electric and/or electronic circuit or components to be received thereon need not be departed from. The same applies essentially if the metal material or metal alloy from which the fuse is made is silver or a silver alloy, or some arbitrary suitable metal or arbitrary suitable metal alloy. The conductor tracks that also form the fuse element should themselves also comprise at least a two-layer coating of the above-described metals or metal alloys. Then, the outer layer has the function of a cover layer or jacket for the material located beneath it.

One essential component for making the fuse element of the invention is the material of the printed circuit board substrate, whether it is in the form of a conventionally made printed circuit board or a plurality of printed circuit boards made by the multilayer technology. It is advantageous to select the material of the printed circuit board substrate such that the printed circuit board substrate material comprises at least one heat-hardened, glass-fiber-reinforced hydrocarbon/ceramic laminate. Material of this kind is available on the market, for instance from the Rogers Corporation under the product name R04000.

In a second advantageous embodiment of the fuse element, the printed circuit board substrate material preferably comprises at least one ceramic-enriched, temperature-conducting epoxy resin laminate, and this material is known and available on the market under the product name Arlon91ML from the Arlon Corporation.

However, it should be expressly pointed out that the two materials named above of which the printed circuit board substrate material is comprised, and which are indicated here only as possible examples that are available on the market, are usable for the embodiment of the invention.

As noted at the outset, the temperature stability, or a better term for it is temperature resistance, of the fuse element is an essential factor for being suitable to be capable of being made integrally with the printed circuit board. In other words, during the same process as the production of the printed circuit board. If a classically constructed printed circuit board substrate is used, and the actual fuse element is formed from the metal or metal alloy lining it, then the fuse element has one side virtually free, so that the fuse element can in this way dissipate heat to the surroundings. However, if the fuse is used in a multilayer system comprising a plurality of printed circuit board substrates resting on one another, then the actual fuse element, which is also somewhat vaguely called a melting conductor, is embedded or laminated completely in the aforementioned multilayer system. As a result, the heat dissipation of the fuse element is consequently more greatly hindered by the currents that flow through the fuse element because of its heating.

In such a case, in order to ensure good heat dissipation, it is advantageous that, in the vicinity of the site of a first printed circuit board substrate of a multilayer system on which the fuse is formed in the metal or the metal alloy, a void is formed in the second printed circuit board substrate resting adjacent to the first printed circuit board substrate, the void being formed as a recess in the second printed circuit board substrate.

By utilizing this advantageous principle to create an unhindered heat dissipation of the actual fuse element, it can furthermore be advantageous, in the vicinity of the site of a printed circuit board substrate on which the fuse (12) is provided in the metal or the metal alloy (15), for one void to be provided in the second printed circuit board substrate resting adjacent to the first printed circuit board substrate and for one void to be provided in the vicinity of the site of the first printed circuit board substrate on which the fuse is provided, the voids being in the form of respective recesses. This has the extraordinary advantage that in fact, the fuse element (melting conductor) is provided with an adjacent void on both of its sides in the multilayer substrate, so that the heat produced by a high current flow through the fuse element can be dissipated to both sides.

This principle of the embodiment of voids adjacent to the actual fuse (melting conductor) can analogously be employed with more than two printed circuit board substrates, positioned on one another, either conventionally or by a multilayer technology.

In many cases, the void is open on the side facing away from the fuse element, so that circulating air or a gaseous ambient medium can also reach the fuse element, either from one side, which is the first possibility described above, or from both sides, which is the second possibility described above.

However, for certain applications it can also be advantageous to close off the void or voids with a layer on the side facing away from the fuse element.

This layer can perform multiple tasks. For instance, it can prevent an electric arc or molten components of the fuse from escaping to the surroundings from the immediate vicinity of the fuse. It is equally capable, upon the occurrence of an electric arc, of preventing the escape of the electric arc from the void to the surroundings.

To be capable of absorbing high pressures in the void as a result of an increase in volume of the air from currents flowing through the fuse without bursting this layer, for instance, it is advantageous to form this layer as a flexible layer, specifically in the manner of a membrane.

Although the membrane should permit an air exchange into the void and out of the void, it also should prevent molten components of the fuse from being able to escape from the void. It also should prevent components adjacent to the fuse element and the multilayer system overall from bursting into flames.

The layer, which typically preferably has a foil-like structure, or in other words has only a slight thickness, can preferably be provided with an additional metal layer. As a result of the metalizing of the layer, this layer can be still further stabilized against thermal and mechanical stress, so that it can even more strongly withstand the aforementioned stresses listed above as examples.

In a further, still different advantageous embodiment of the fuse element, the metal or metal alloy forming the actual melting part of the fuse has a plurality of through-holes. However, it can also be advantageous to either alternatively or additionally provide the printed circuit board substrate, in the vicinity of the melting part of the actual fuse, with a plurality of through-holes. As a result of this the thermal conductivity of the metal or metal alloy and/or the thermal conductivity of the actual printed circuit board substrate material can be varied. As a result, for instance, the characteristic time-current curve of the fuse can be designed as faster-acting or slower-acting. Moreover, by means of this provision, the current-time integral can be varied.

The fuse element can preferably be further formed such that at least one void is at least partly filled with an insulating means. This insulating means essentially has the function of preventing inflammation upon melting of the fuse, or in other words of acting as an arc quenching medium. Insulating means of this kind can for instance be silicone, sand, or air. They can also be the materials of which the above-described preferred materials are constructed, that is, those that the printed circuit board substrate material itself comprises. By means of the insulating means, an electric arc that can normally occur upon melting of the fuse can moreover be largely suppressed.

In principle, there are no limitations in the mechanical or geometric sizes for the embodiment of the fuse element of the invention. However, if the fuse element of the invention is to be received, just like other electric and/or electronic components, on conventional printed circuit board substrates or printed circuit board substrates like the aforementioned multilayer technology, then it is advantageous that the face in which the layer is formed essentially determines the face of the body of the fuse element in two dimensions. In other words, the size of the face of the layer in the x-y plane corresponds to the size of the face of the fuse element in plan view. In a practical sense, the face can correspond to the face of the kind encountered, for instance, in typical integrated circuits of rectangular, square or even circular form.

The height of the fuse element is preferably determined at least by the thickness of two printed circuit board substrates resting on one another, plus the thickness of the metal melting part of the conductor that forms the actual fuse, or in other words in a third dimension. In discrete fuse elements not constructed by conventional printed circuit board technology or the multilayer technology, the height or total thickness can be oriented to the height or thickness of typical models of integrated circuits.

In the case of the aforementioned discrete model of fuse elements according to the invention, in a further, different advantageous embodiment of the fuse element, both ends of the melting part of the fuse element have connection terminals, by way of which the fuse element can be connected to the remainder of the electric and/or electronic circuit on the printed circuit board substrate or multilayer substrate, or also to separate lines with which the two poles of the fuse can be connected.

Finally, in the fuse element of the invention, if as noted it has an essentially three-dimensional embodiment, or in other words is made as a fuse element of discrete construction, the body that forms the fuse element can have the aforementioned connection terminals. These are designed such that they are connected to the two ends (poles) of the melting conductor by means of plated through-hole connections.

DESCRIPTION OF THE DRAWINGS

The invention will now be described in detail in terms of two exemplary embodiments in conjunction with the ensuing schematic drawings. In the drawings.

DETAILED DESCRIPTION

First, to the views in FIGS. 1 and 2 will be discussed, in which a fuse element 10 of a first embodiment of the invention is shown.

Figure 1:
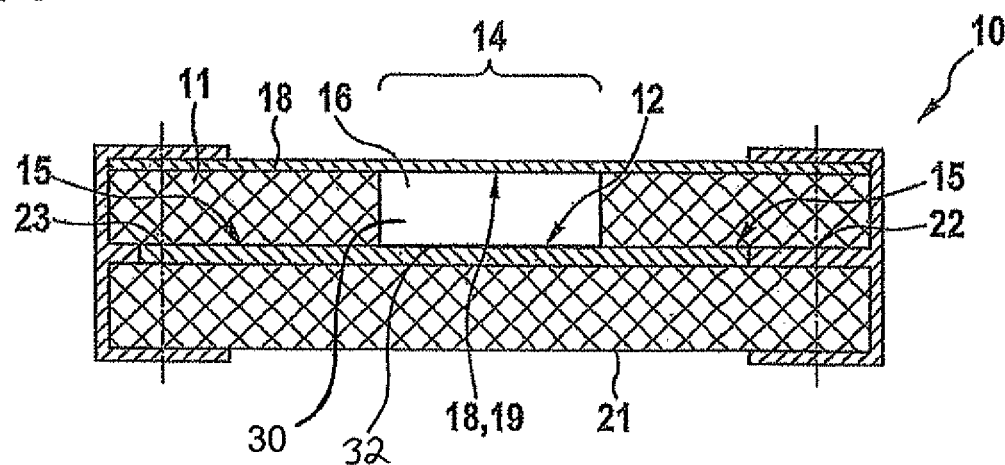
FIG. 1, in a greatly enlarged side view, shows a fuse element of the invention in which a void is provided above the melting conductor that forms the actual fuse.
Figure 2:
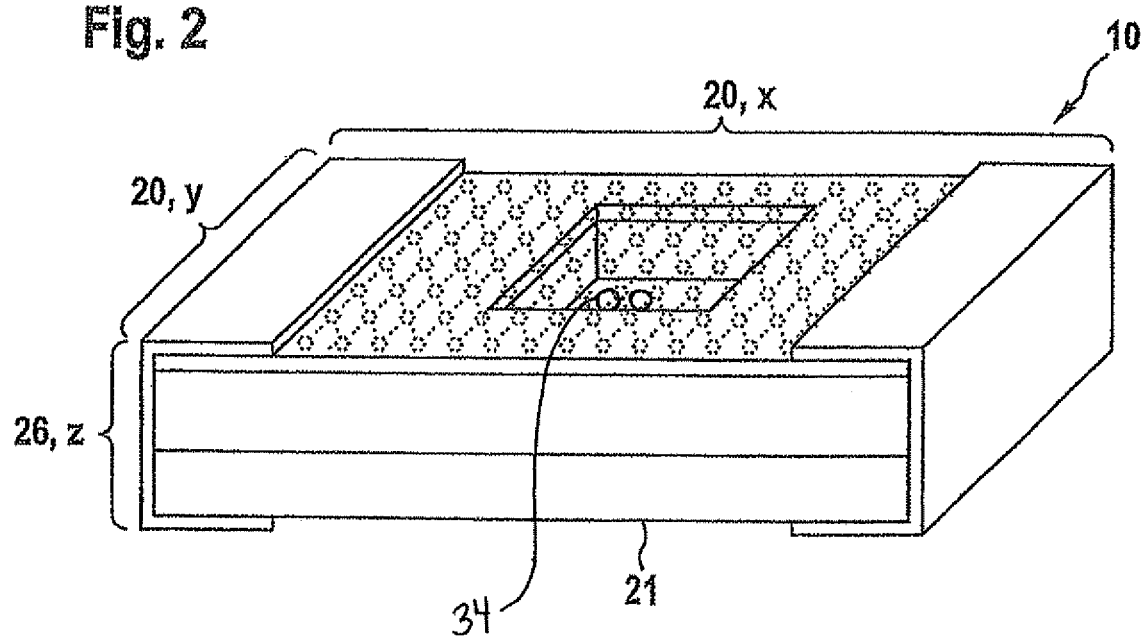
FIG. 2 is a view corresponding to FIG. 1, but in perspective.

FIGS. 1 and 2 pertain to the fuse element 10, in which the fuse 12 of the invention is provided on a printed circuit board substrate or printed circuit board substrate material 11. The fuse 12 is provided on the printed circuit board substrate 11, which is coated in a known manner with a metal or metal alloy 12 by a coating procedure, and the fuse 12 is generated by means of photolithographic and/or printing image-producing techniques, such as screen printing, and ensuing etching or engraving processes, as is generally done to make printed circuit boards with conductor tracks that are to be provided on the printed circuit boards. Both conventionally constructed printed circuit board substrates with one- and/or two-sided coating with metal or metal alloys and the known printed circuit board substrates that are formed by the multilayer technology or used for it, are intended for the printed circuit board substrate material 11 or printed circuit board substrate.

As the printed circuit board substrate material, an at least high-temperature-stable material is used, and at least its coefficient of thermal expansion varies essentially corresponding with the coefficient of thermal expansion of the metal or metal alloy 25 of which the fuse 12 is made.

Figure 5:
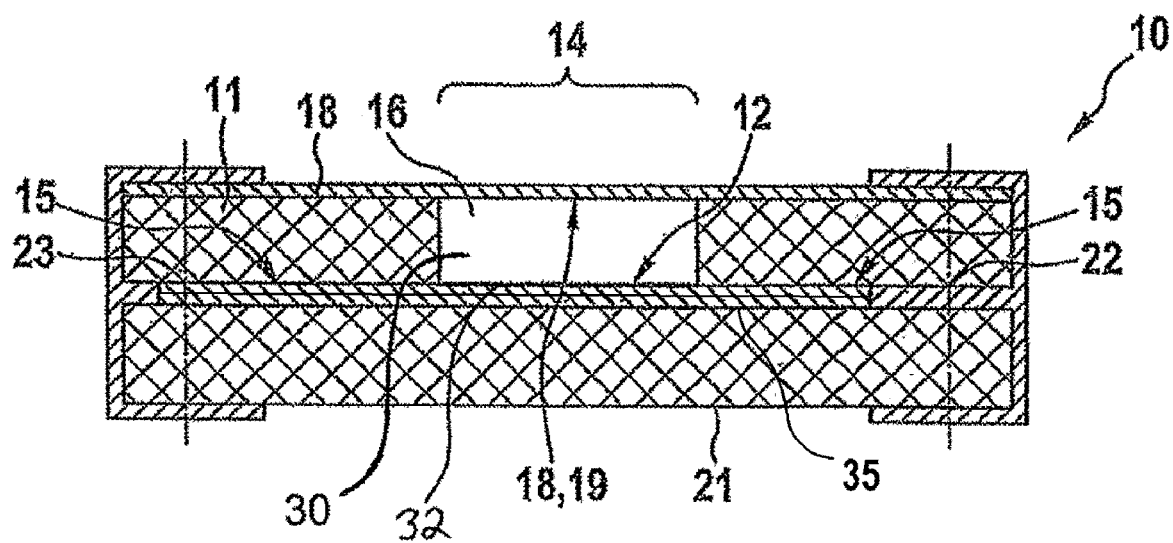
FIG. 5 is a view corresponding to FIG. 1 but showing a plurality of layers of metal or a metal alloy.

It should be pointed out that the metal material or the metal alloy from which the fuse 12 is generated is typically copper or a copper alloy, but it will also be expressly noted that still other metals and metal alloys, such as silver and silver alloys, that are suitable for making electric fuses 12 of this generic type can be used. Multilayer structures, for instance with copper or a copper alloy as the first layer and a layer of silver or silver alloy on top of it, can also form the fuse 12. Multilayer structures with arbitrary suitable metals and metal alloys are also possible within the scope of the invention. A fuse comprising a plurality of layers of metal or a metal alloy is shown in FIG. 5. For example, a layer of metal or metal alloy 15 is located adjacent a second layer of metal or a metal alloy 35.

Above or below the layer of metal or metal alloy 15, which lines the printed circuit board substrate 11 and from which the conductor tracks of a printed circuit board can also be formed, and also in the present case in which the actual fuse 12 is formed in the manner described above, there is a void 16 located in the vicinity of the site 14 at which the fuse 12 is formed in the metal or metal alloy 15. The void 16 is at least partly closed or closed off by means of a layer 18 with a foil-like structure, specifically on the side 17 facing away from the actual fuse 12. The layer 18 can also be a membrane that is permeable in both directions for certain gaseous media, such as air, so that the actual fuse 12 can be acted upon for instance by air circulation. However, it is also possible, either alternatively or additionally, to provide the layer 18 with an additional metal layer 19. For instance, the additional layer may be provided by means of vapor deposition of metal, so that the gaseous ambient medium can still pass through. But an electric arc, which may form for example, at the fuse 12 because of an overload after the melting of the melting part 32 of the fuse, cannot escape from the void 16.

In the vicinity of the fuse 12, the printed circuit board substrate 11, and this applies equally to the printed circuit board substrates 110, 111 that will be described below in conjunction with the second embodiment of the fuse element shown in FIGS. 3 and 4. Through-holes 34 can be formed (as shown in FIG. 2), which can be created for instance by means of laser devices, by means of which the characteristic time-current curve of the fuse 12 can be designed as faster-acting or slower-acting, and the current-time integral can also be varied by means of this provision. It is equally possible for the metal or metal alloy that forms the melting part of the fuse to have a plurality of such through-holes, so that by that means as well, either alternatively or in addition, it is possible to vary the aforementioned parameters. The void 16 and/or the void 16, 160 of the embodiment of the fuse element 10 of FIGS. 3 and 4 can be filled at least in part by an insulating means 30 (as shown in FIG. 1); this insulating means can for instance be sand, silicone, powdered quartz, or other suitable electrically nonconductive arc quenching media. Glass, sand, quartz or ceramic, for instance in bead form, can also at least partly fill the void 16 or the voids 16, 160. Mixtures of the aforementioned materials are also possible.

In the embodiment of the fuse element 10 of FIGS. 3 and 4, a void 16, 160 is formed both above and below the fuse 12 in the printed circuit board substrate 110, 111, so that the effects described in conjunction with the embodiment of the fuse element 10 along with the views in FIGS. 1 and 2 can act as it were from both sides on the fuse 12. This applies equally to the layer 18, as it has already been described in conjunction with FIGS. 1 and 2 for the fuse element 10 shown there.

Based on the views of the embodiment of the fuse element 10 in FIGS. 3 and 4, reference will be made to an embodiment, not shown here, of the fuse elements 10 which, with the same construction as those shown in FIGS. 3 and 4, do not have an adjacent void 16. The two fuses 12, 13, spaced apart from and essentially parallel to one another, are in fact laminated into or from the adjacent printed circuit board substrates 110, 110.

It is also possible by this above-described principle of the construction to construct multi-layered structures, for instance on the principle of multilayer printed circuit board substrates, with and without respective adjacent voids 16, 160.

Such embodiments of the fuse elements 10 and of the actual fuses 12, 13 also permit the simple construction of fuses connected electrically in series and/or parallel.

The face 20 of the layer 18 defined by the length x and the width y, see FIG. 2, essentially determines the face of the body 21 of the fuse element 10. The thickness 26 is determined essentially by two printed circuit board substrates 110, 111 resting on one another, plus the thickness of the conductor forming the metal melting part of the fuse 12, or in other words the third dimension z. The volume of the body 21 of the fuse element 10 can be designed intrinsically arbitrarily, for instance in the form of a right parallelepiped, a cube, or a columnar portion of circular cross section. Arbitrary other suitable mixed forms of the shape of the volume of the body 21 are also possible, however. For instance, the body 21 of the fuse element 10 can also be made like an integral circuit, or the kind known in the field of electric and/or electronic circuits.

Figure 3:
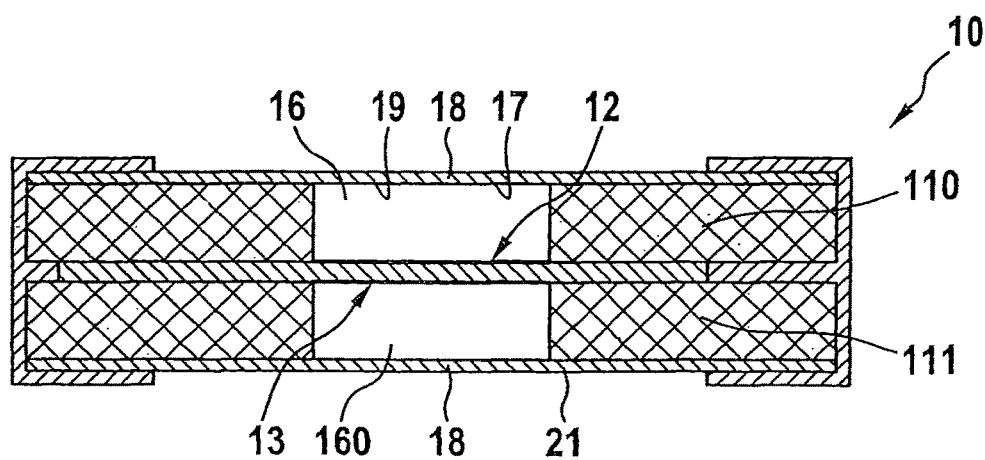
FIG. 3 shows the fuse element in side view as in FIG. 1, but showing a second embodiment, in which a void is provided both above and below the melting conductor that forms the actual fuse.
Figure 4:
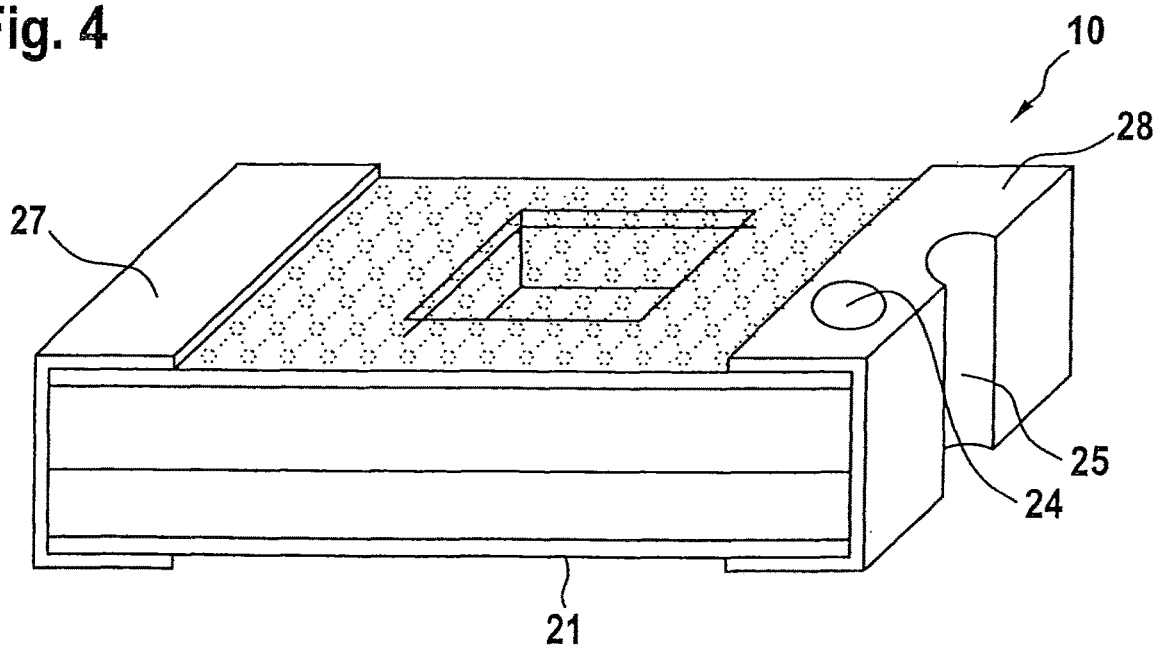
FIG. 4, in a perspective view, shows the second embodiment of the fuse element shown in FIG. 3, in which plated through-holes are also visible as conductive terminals to one of the poles or ends of the fuse.

The fuse element 10 in the embodiment of FIGS. 3 and 4 has metal terminals 27, 28, facing the two face ends, which form the terminal pole for the fuse element 10. The two ends 22, 23 of the actual melting part of the fuse 12, shown in FIG. 1 as an intersection point with the line that extends vertically and is shown in dot-dashed lines, are provided with connection terminals 24, 25, which can be formed as plated through-holes, of the kind generally used in printed circuit boards for electric and/or electronic circuits.

LIST OF REFERENCE NUMERALS

10 Fuse element
11 Printed circuit board substrate, printed circuit board substrate material
110 First printed circuit board substrate/first printed circuit board substrate material
111 Second printed circuit board substrate/second printed circuit board substrate material
12 Fuse
13 Fuse
14 Site
15 Metal/metal alloy
16 Void
160 Void
17 Side
18 Layer
19 Metal layer
20 Face
21 Body (fuse element)
22 End
23 End
24 Connection terminal
25 Connection terminal
26 Thickness
27 Terminal (pole)
28 Terminal (pole)
30 Insulating Means
32 Melting Part
34 Through-holes
35 Second layer

What is claimed is:

1. A fuse element for use in electric and/or electronic circuits constructed by multilayer technology, comprising a printed circuit board substrate material, coated with a metal or metal alloy defining a fuse and being formed by photolithographic and/or printing image-producing techniques and ensuing etching or engraving processes, wherein the printed circuit board substrate material, on which the fuse is provided, comprises at least a high-temperature-stable, electrically insulating material, and wherein the printed circuit board substrate material has a coefficient of thermal expansion that varies essentially corresponding with the coefficient of thermal expansion of the metal or metal alloy from which the fuse is formed.

2. The fuse element as defined by claim 1, wherein the metal material or metal alloy defining the fuse comprises copper or a copper alloy.

3. The fuse element as defined by claim 1, wherein the metal material or the metal alloy defining the fuse comprises silver or a silver alloy.

4. The fuse element as defined by claim 1, wherein the fuse comprises a plurality of layers of metal or a metal alloy.

5. The fuse element as defined by claim 4, wherein an outer layer of the plurality of layers comprises silver or a silver alloy.

6. The fuse element as defined by claim 1, wherein the printed circuit board substrate material comprises at least one heat-hardened, glass-fiber-reinforced hydrocarbon/ceramic laminate.

7. The fuse element as defined by claim 1, wherein the printed circuit board substrate material comprises at least one ceramic-enriched, temperature-conducting epoxy resin laminate.

8. The fuse element as defined by claim 1, comprising a first printed circuit board substrate on which the fuse is provided and a second printed circuit board substrate disposed adjacent to the first printed circuit board substrate.

9. The fuse element as defined by claim 8, wherein in the vicinity of the location of the first printed circuit board substrate on which the fuse is provided, a void is provided in the second printed circuit board substrate, the void being in the form of a recess in the second printed circuit board substrate.

10. The fuse element as defined by claim 8, wherein in the vicinity of the location of the first printed circuit board substrate on which the fuse is provided, one void is provided in the second printed circuit board substrate and one void is provided in the vicinity of the location of the first printed circuit board substrate on which the fuse is provided, the voids being in the form of respective recesses.

11. The fuse element as defined by claim 9, wherein the void is closed off with a layer with a foil-like structure on a side facing away from the fuse.

12. The fuse element as defined by claim 11, wherein the layer is a permeable membrane.

13. The fuse element as defined by claim 11, wherein the layer is a flexible layer.

14. The fuse element as defined by claim 11, wherein the layer comprises a metal layer.

15. The fuse element as defined by claim 1, wherein the printed circuit board substrate, at least in the vicinity of a part of the fuse configured to melt, has a plurality of through-holes.

16. The fuse element as defined by claim 1, wherein the metal or metal alloy defining a part of the fuse configured to melt has a plurality of through-holes.

17. The fuse element as defined by claim 9, wherein the void is at least partly filled with an insulating material.

18. The fuse element as defined by claim 11, wherein a face on which the layer is provided essentially determines a face of a body of the fuse.

19. The fuse element as defined by claim 11, wherein at least the thickness of two printed circuit board substrates resting on one another, plus the thickness of a conductor forming a melting part of the fuse element, determines the thickness of a body of the fuse element.

20. The fuse element as defined by claim 1, wherein opposing ends of a part of the fuse element configured to melt are provided with connection contacts.

21. The fuse element as defined by claim 20, wherein, in a three-dimensional embodiment of a body forming the fuse element, the connection contacts are connected to ends of the melting part of the fuse by plated through-hole connections.

22. The fuse element as defined by claim 1, wherein the fuse is made integrally with the printed circuit board substrate material.

23. The fuse element as defined by claim 1, further comprising a void in the printed circuit board substrate material, wherein the void is closed off with a gas-permeable layer on a side facing away from the fuse.

24. The fuse element as defined by claim 1, wherein a part of the fuse is adapted to melt, and wherein the printed circuit board substrate material includes a void, such that the part of the fuse adapted to melt extends beyond the void.

25. A fuse element, particularly suitable for use in the multilayer technology, in which electrical and/or electronical circuits are constructed, comprising a printed circuit board material, coated with a metal or metal alloy defining a fuse and being formed by photolithographic and/or printing image-producing techniques and ensuing etching or engraving processes, wherein the printed circuit board substrate material comprises at least a high-temperature-stable, electrically insulating material having a coefficient of thermal expansion that passes essentially analogous with the coefficient of thermal expansion of the metal or metal alloy from which the fuse is formed.

* * * * *